(12) United States Patent
Kanesashi

(10) Patent No.: US 7,635,277 B2
(45) Date of Patent: Dec. 22, 2009

(54) SOCKET FOR ELECTRICAL PART

(75) Inventor: Hokuto Kanesashi, Saitama (JP)

(73) Assignee: Enplas Corporation, Saitama (JP)

( * ) Notice: Subject to any disclaimer, the term of this patent is extended or adjusted under 35 U.S.C. 154(b) by 147 days.

(21) Appl. No.: 11/782,903

(22) Filed: Jul. 25, 2007

(65) Prior Publication Data
US 2008/0026611 A1 Jan. 31, 2008

(30) Foreign Application Priority Data
Jul. 27, 2006 (JP) ............... 2006-204326

(51) Int. Cl.
H01R 13/62 (2006.01)
(52) U.S. Cl. .................. 439/331; 439/268
(58) Field of Classification Search ............ 439/331, 439/268, 70, 73, 266
See application file for complete search history.

(56) References Cited

U.S. PATENT DOCUMENTS

| 6,027,355 | A | 2/2000 | Ikeya | |
| 7,165,986 | B2* | 1/2007 | Hayakawa | 439/268 |
| 2002/0009915 | A1* | 1/2002 | Fukunaga | 439/331 |
| 2003/0171021 | A1* | 9/2003 | Okamoto | 439/331 |
| 2006/0046554 | A1* | 3/2006 | Cram et al. | 439/331 |
| 2006/0094278 | A1 | 5/2006 | Hayakawa | |

FOREIGN PATENT DOCUMENTS

| GB | 2 303 003 | 2/1997 |
| GB | 2 437 178 | 10/2007 |
| JP | 8-64320 | 3/1996 |
| JP | 11-26126 | 1/1999 |

OTHER PUBLICATIONS

United Kingdom Intellectual Property Office Search Report dated Nov. 20, 2007 for corresponding U.K. Application No. 0714642.6.

* cited by examiner

Primary Examiner—Hien Vu
(74) Attorney, Agent, or Firm—Staas & Halsey LLP

(57) ABSTRACT

A socket for an electrical part, such as IC socket, to be mounted on a printed circuit board is provided with a socket body, and a plurality of contact pins are mounted to the socket body so as to electrically connect the electrical part and the printed circuit board. The contact pin includes a base portion, an elastic piece extending upward from the base portion, a lead portion extending downward from the base portion, and a contact portion formed to a tip end of the elastic piece. The lead portion is inserted into an insertion hole formed to the printed circuit board. The contact pins are inserted into the socket body of the IC socket from the lower side thereof so that the base portion of each contact pin is fitted to a base portion fitting hole portion, and the base portion is pressed by a locating board disposed to the lower side of the socket body.

5 Claims, 18 Drawing Sheets

FIG.2
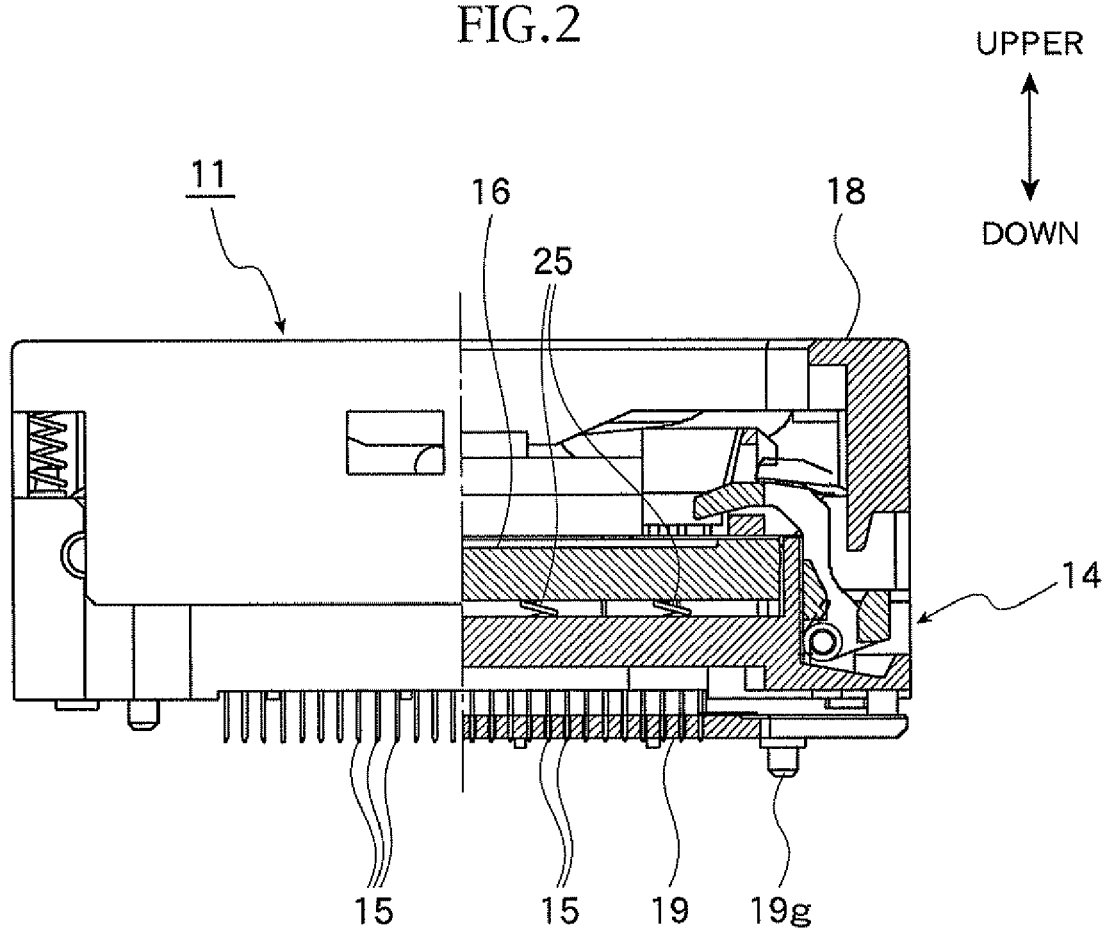
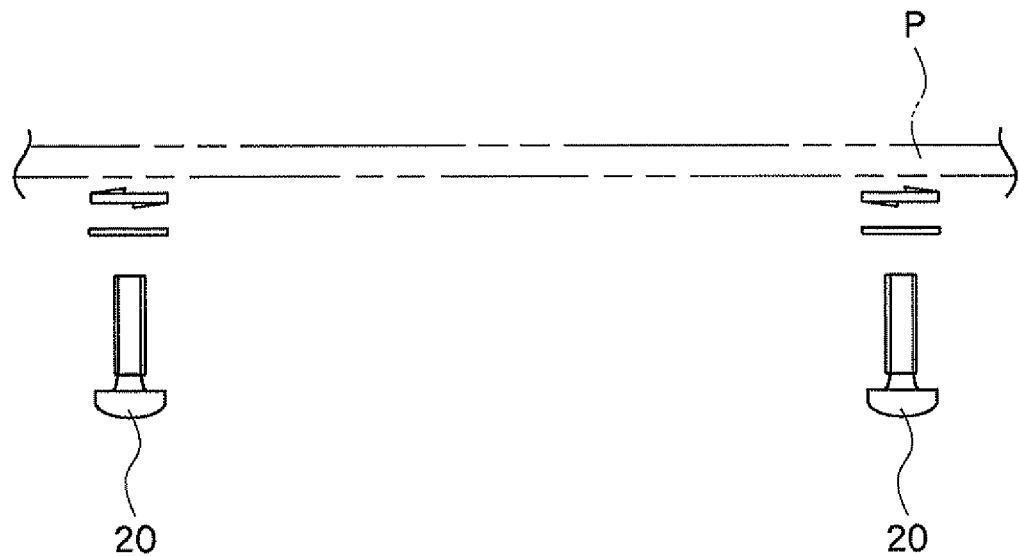

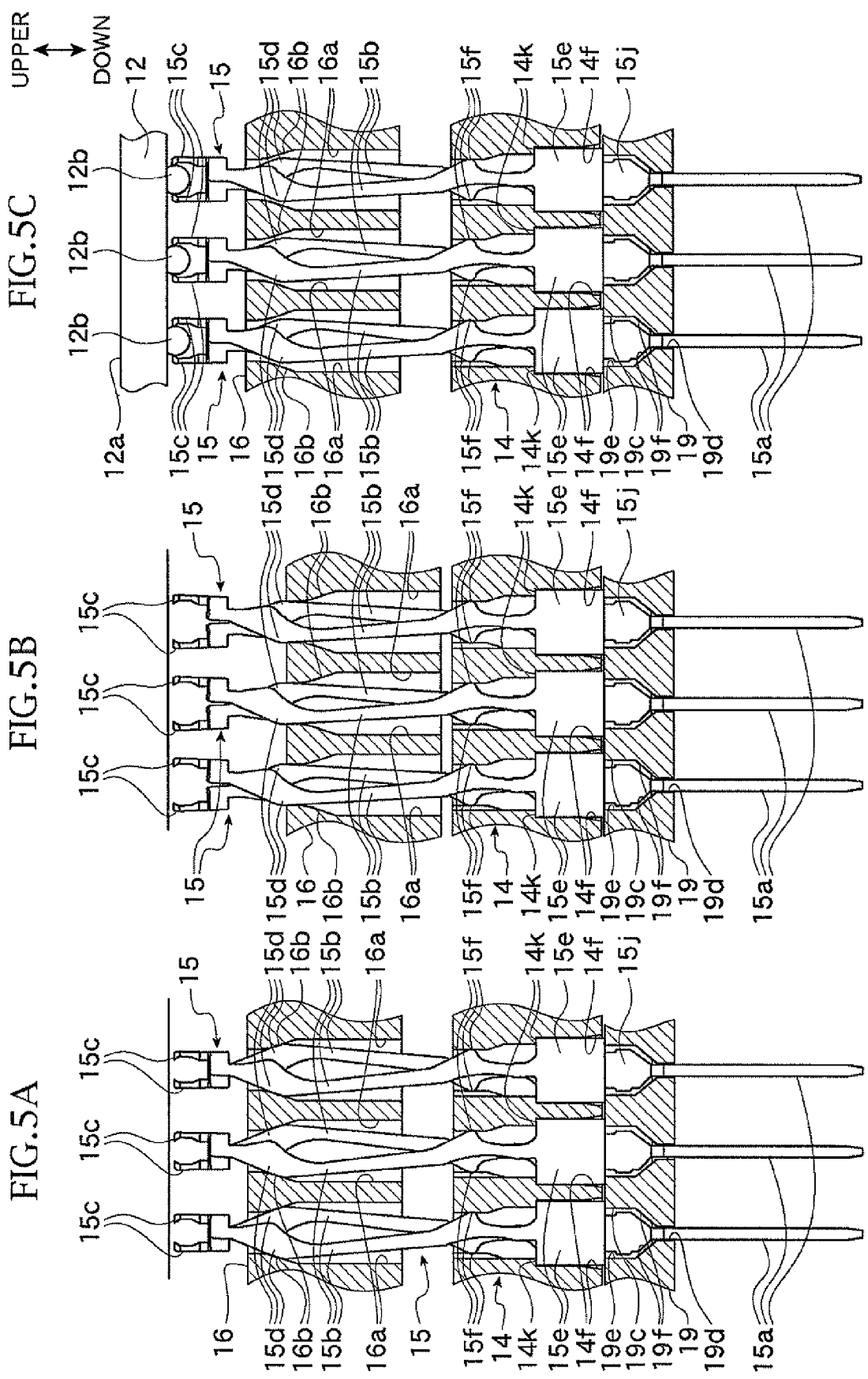

SOCKET FOR ELECTRICAL PART

CROSS REFERENCE TO RELATED APPLICATIONS

This application is based on and claims priority to Japanese Application No. 2006-204326, filed on Jul. 27, 2006, the disclosure of which is hereby incorporated herein by reference.

BACKGROUND OF THE INVENTION

1. Field of the Invention

The present invention relates to a socket for an electrical part for accommodating an electrical part such as semiconductor, which will be called hereinlater "IC package".

2. Related Art

There is known an IC socket, as a socket for an electrical part, for accommodating an IC package.

The IC socket is disposed on a printed circuit board, and the IC package is mounted on a socket body of the IC socket in such a manner that the printed circuit board is electrically connected to terminals of the IC package through a plurality of conductive contact pins disposed to the IC socket to perform a burn-in test of the IC package.

The contact pins are press-fitted into the socket body with a predetermined pressure so as not to come off therefrom, and a lead guide (locating board) is mounted to be movable on a lower surface side of the socket body.

The contact pin has a lead portion which is inserted into an insertion hole formed to the lead guide and thereby positions the contact pin to make easy the insertion of the contact pin into the insertion hole of the circuit board (see, for example, Patent Publication: Japanese Unexamined Patent Application Publication No. JP H11-26126 A1).

Furthermore, a prior art further provides a structure in which the contact pin is inserted into the socket body and the inserted contact pin is supported by an adaptor disposed to the lower side of the socket body (see, for example, Patent Publication 2: Japanese Unexamined Application Publication No. JP H8-64320 A1).

However, in the structure shown in the Patent Publication 1, it is necessary to make large a pressing force for pressing the contact pin against the socket body to ensure a contact pin holding force. Such pressing working is troublesome and there is a fear that the contact pin, having a weak strength, may be damaged when fitted and inserted. In addition, it is also necessary to dispose the adapter independently, which requires much working process and locating space, thus being inconvenient.

SUMMARY OF THE INVENTION

The present invention was conceived in consideration of the above circumstances in the prior art, and an object thereof is to provide a socket for an electrical part capable of easily and surely arranging the contact pins with reduced mounting works.

In order to achieve the above object, according to one aspect of the present invention, there is provided a socket for an electrical part to be mounted on a printed circuit board and provided with a socket body, in which an electrical part is accommodated in the socket body and a plurality of contact pins are mounted to the socket body so as to electrically connect the electrical part and the printed circuit board, wherein:

the contact pin includes a base portion, an elastic piece extending upward from the base portion, a lead portion extending downward from the base portion, and a contact portion formed to a tip end of the elastic piece to be electrically contacted to the electrical part, the lead portion being inserted into an insertion hole formed to the printed circuit board;

the socket body is formed with a through hole into which the contact pin is inserted, and the through hole is formed with a base portion fitting hole portion into which the base portion is fitted so as to restrict an upward movement of the contact pin; and a locating board is disposed, to be vertically movable, on a lower side of the socket body, the locating board being formed with a plurality of insertion holes into which the lead portions of the contact pins are inserted, and when the locating board is separated from the lower surface of the socket body, the lead portion of the contact pin is positioned to a position corresponding to the insertion hole of the printed circuit board, and when the locating board approaches most closely the lower surface of the socket body, the locating board contacts the lower surface of the base portion of the contact pin so as to restrict a downward movement of the contact pin.

In a preferred embodiment of the above aspect, it may be desired that the contact pin is formed from a conductive plate member and is provided with a pair of elastic pieces, and the base portion is bent so as to provide a U-shaped horizontal section.

It may be also desired that the contact pin is provided with an intermediate portion in shape of plate between the base portion and the lead portion, the intermediate portion having a width smaller than that of the base portion and larger than that of the lead portion, and the insertion hole of the locating board is formed with an intermediate insertion portion into which the intermediate portion is inserted and the lead insertion portion into which the lead portion is inserted, the intermediate insertion portion having a width larger than that of the lead insertion portion. It may be further desired that the intermediate insertion portion has a pair of tapered surfaces so as to reduce a width toward the lead insertion portion, and when the lead portion is inserted into the locating board, the tip end of the lead portion is guided by the tapered surfaces so as to be inserted into the lead insertion portion.

According to the present invention of the characters mentioned above, when the socket for an electrical part is mounted on the printed circuit board, the contact pin is inserted into the through hole from the lower side of the socket body, and by fitting the base portion of the contact pin to the base portion fitting hole portion of the socket body, the contact pin can be mounted with a relatively weak force, and any deformation of the contact pin can be prevented from causing, thus improving amounting working. According to such fitting, the contact pin can be held with a force of an extent not to come off from the socket body.

In addition, the lead portion of the contact pin can be easily and accurately inserted into the insertion hole formed to the printed circuit board by positioning the lead portion of the contact pin to the position corresponding to the insertion hole of the printed circuit board in a state that the locating board is separated from the lower surface of the socket body.

Furthermore, by mounting the socket for the electrical part to the printed circuit board, the locating board approaches most closely the lower surface of the socket body, and then, the locating board abuts against the lower surface of the base portion of the contact pin to thereby restrict or limit the downward movement of the contact pin, and the socket body can specify the position of the contact pin in its height direction.

Accordingly, since the locating board can attain the function of a conventional adapter, it is not necessary to additionally locate such adapter, thus reducing the number of parts to be located and mounting working, in addition to the elimination of a space for the location of the adapter, the miniaturization of the socket for the electrical part, improvement of the physical strength of other parts or components and improvement in design freedom. It is not necessary to make aligning working of the socket body and the adapter.

According to the other structure of the present invention, the base portion has a U-shaped horizontal section, and the base portion is fitted to the base portion fitting hole portion, so that the base portion is not flat and has some thickness, and accordingly, the base portion can be easily fitted to the base portion fitting hole portion of the socket body.

Furthermore, the contact pin has the plain-like intermediate portion at a place between the base and the lead portion. The intermediate portion has a width smaller than that of the base portion and larger than that of the lead portion, and the locating board is formed with an intermediate insertion portion into which the intermediate portion is inserted, the intermediate insertion portion having a width larger than that of the insertion hole into which the lead portion is inserted. Accordingly, the intermediate portion can be effectively utilized for the connection portion to the base material at the time of forming the contact pins, and by cutting the connection portion with the intermediate portion having a slightly wide width being held, the contact pin can be formed in good condition.

Incidentally, when it is required to form the connection portion to the lead portion and the connection portion is cut off from the base material with the lead portion being held, there is a fear of the lead portion being deformed.

On the other hand, when it is required to form the connection portion to the base portion and the connection portion is cut off from the base material with the base portion being held, it is difficult to maintain the base portion having the U-shaped section because the base portion is formed into an U-shape.

Moreover, the intermediate portion in the form of plate has the width smaller than that of the base portion and larger than that of the lead portion, and is inserted into the intermediate insertion portion formed to the locating board, so that when the base portion is held by the locating board, the intermediate portion does not constitute any obstacle, and the base portion can be hence surely held.

Furthermore, the formation of a pair of tapered surfaces to the intermediate portion so as to reduce the width toward the lead insertion portion makes easy the guidance and insertion of the tip end portion of the lead portion of the contact pin when the lead portion is inserted into the lead insertion portion of the locating board. Thus, the contact pin can be easily positioned to the predetermined position.

The nature and further characteristic features of the present invention will be clearer from the following descriptions made with reference to the accompanying drawings.

BRIEF DESCRIPTION OF THE DRAWINGS

In the accompanying drawings:

FIG. 2 is a side view, partially shown in section, of the IC socket of the one embodiment;

FIGS. 4A to 4C represent a contact pin, in which FIG. 4A is a front view of the contact pin, FIG. 4B is a side view thereof, and FIG. 4C is a sectional view taken along the line IVC-IVC in FIG. 4B;

FIGS. 5A to 5C represent an arrangement of contact pins, in which FIG. 5A shows a state that a contact portion of the contact pin is closed, FIG. 5B shows a state that the contact portion of the contact pin is opened, and FIG. 5C shows a state that a solder ball of an IC package is clamped by the contact portions of the contact pin;

FIGS. 11A to 11C show a structure of a locating board insertion hole, in which FIG. 11A is a plan view showing a plurality of insertion holes of the locating board, FIG. 11B is a sectional view taken along the line XIB-XIB in FIG. 11A, and FIG. 11C is a sectional view taken along the line XIC-XIC in FIG. 11A;

FIGS. 18A and 18B represent an IC package, in which FIG. 18A is a front view thereof and FIG. 18B is a bottom view thereof.

DESCRIPTION OF THE PREFERRED EMBODIMENT

Figure 1:
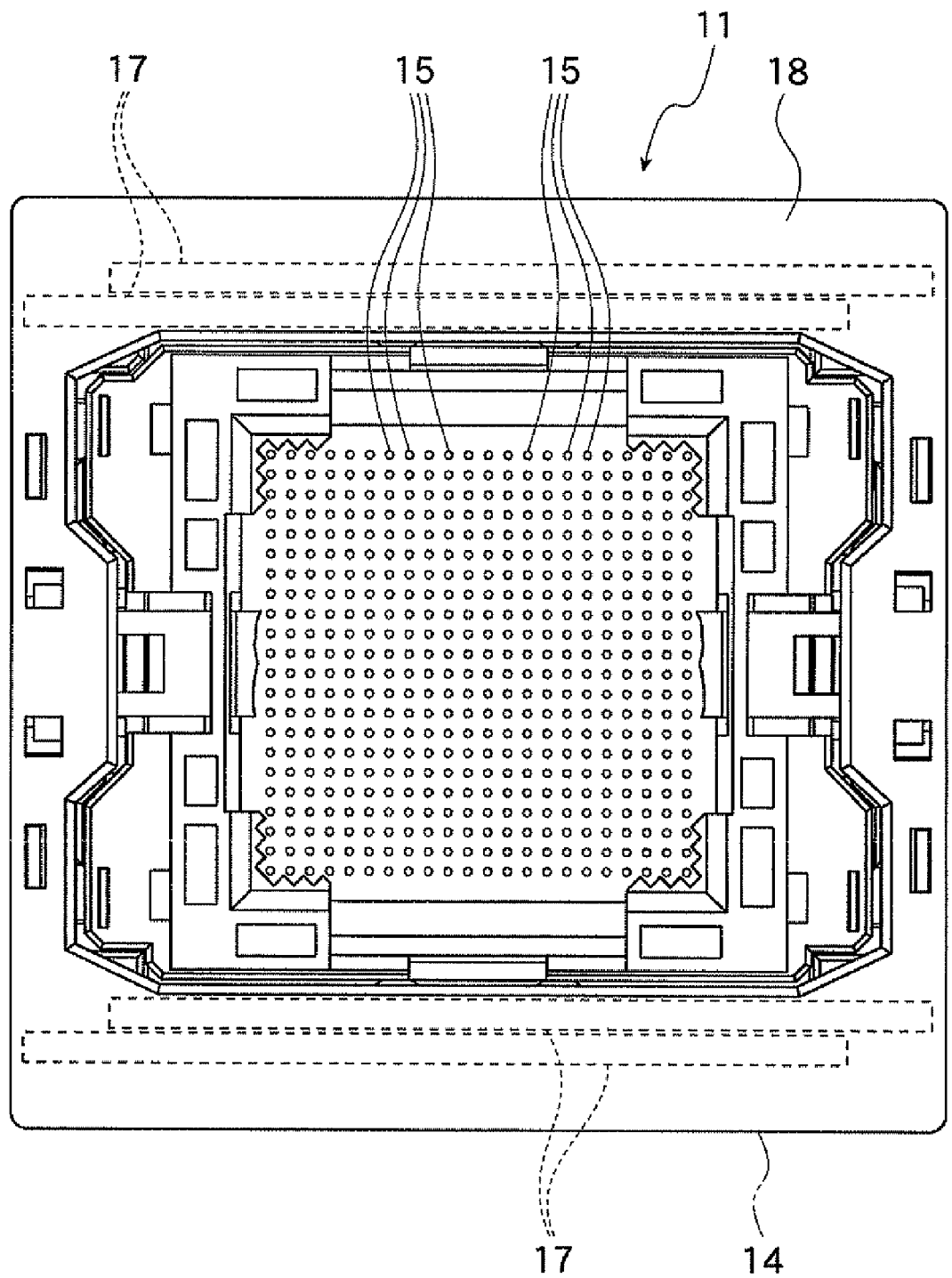
FIG. 1 is a plan view of an IC socket according to one embodiment of the present invention.

A preferred embodiment of the present invention will be described hereunder with reference to the accompanying drawings. Further, it is to be noted that terms "upper", "lower", "right", "left" and the like terms are used herein with reference to the illustrations of the drawings or in an installed state of the IC socket.

With reference to the drawings, reference numeral 11 denotes an IC socket as "socket for an electrical part", and the IC socket 11 is a socket for accommodating an IC package 12 as an "electrical part" (see FIGS. 5A, 5B, 5C, 18A and 18B), and a burn-in test of the IC package 12 will be performed through an electrical connection of the IC package 12 to a circuit board (printed circuit board) P.

Figure 18A:
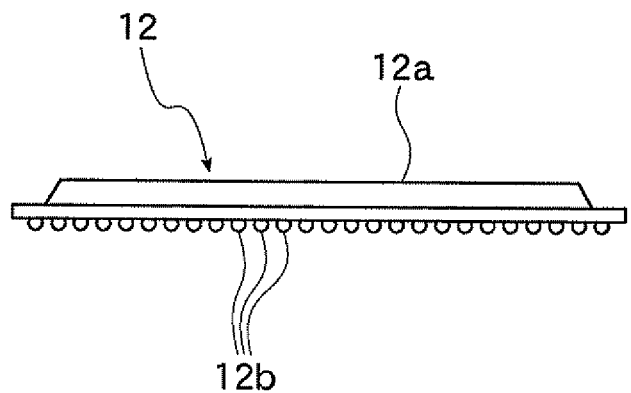
Figure 18B:
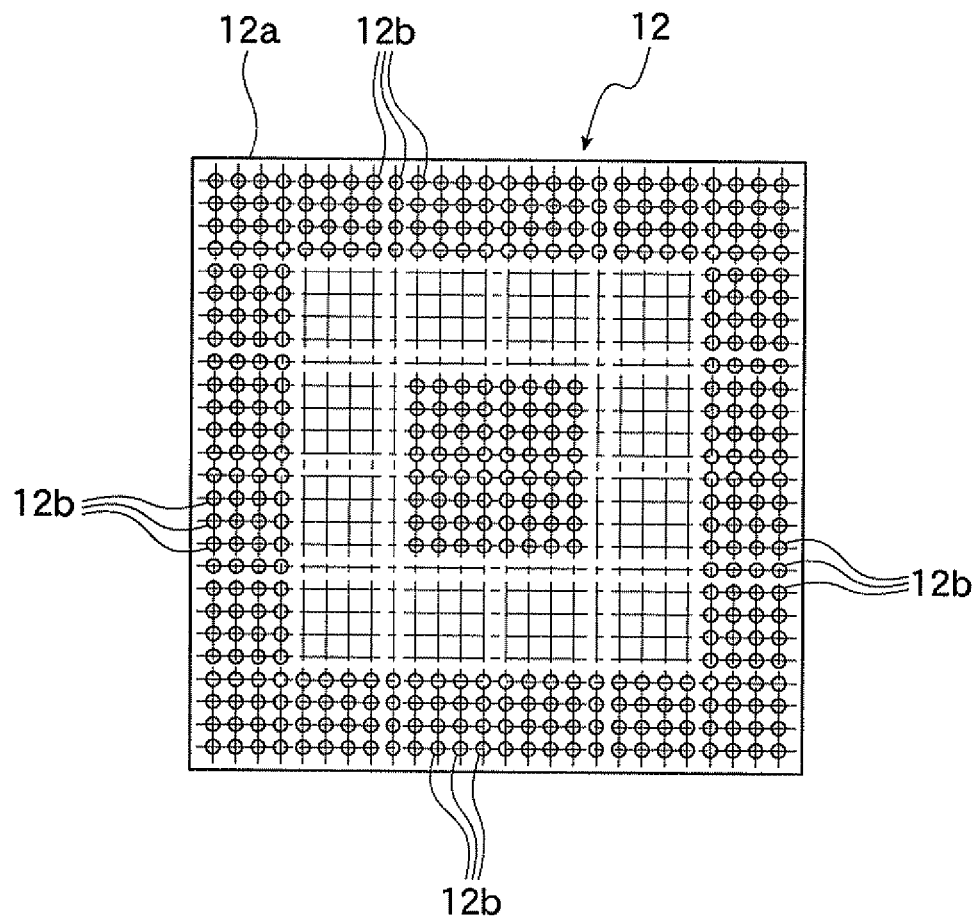

The IC package 12 is, as shown in FIGS. 18A and 18B, provided with a plurality of solder balls 12b, each having a spherical shape, as "terminals" on the lower surface of a package body 12a as an "square electrical part body".

Figure 3:
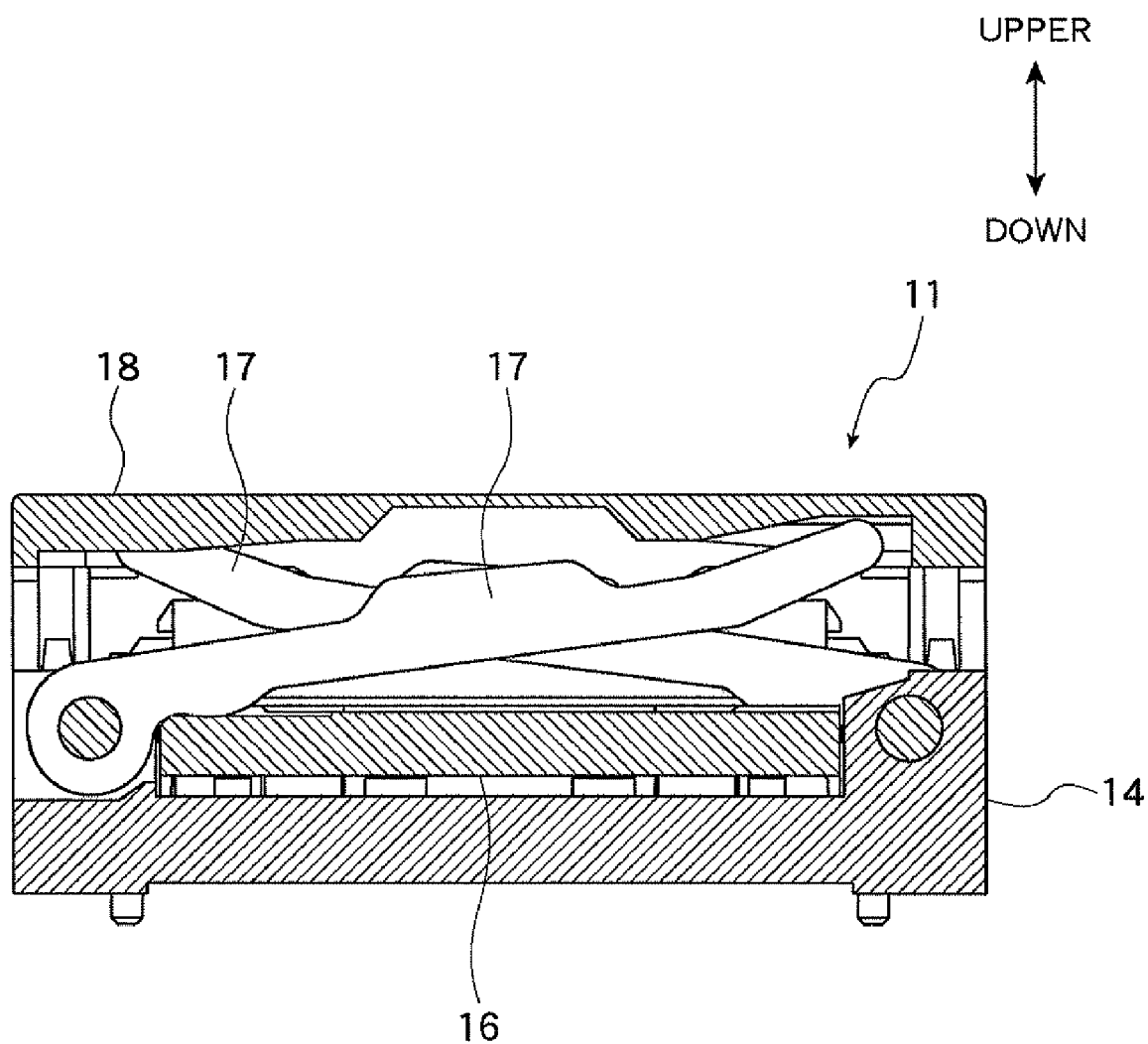
FIG. 3 is a sectional view of the IC socket.

On the other hand, the IC socket 11 has the socket body 14 to which a plurality of contact pins 15 are arranged as shown in FIGS. 1 to 3. The contact pins 15 are electrically connected to terminals (solder balls 12b) of the IC package 12. The IC socket 11 is further provided with a movable (moving) member 16 to be vertically movable to thereby elastically deform the contact pins 15, and an operation member 18 is further provided, to be vertically movable, to the IC socket 11 for vertically moving the movable member 16 through a lever member 17. A locating (locate) board 19 for positioning and holding the contact pins 15 at the time of arranging the IC socket 11 is provided to the lower side of the socket body 14.

Each of the contact pins 15 is formed by punching out a sheet of conductive plate in a predetermined shape and then bending the punched-out plate (by means of press working) so as to provide the shape shown in FIGS. 4A, 4B, 5A, 5B and 5C. The bent plate has a bent base portion 15e having a substantially U-shaped section in a horizontal direction (FIG. 4C).

A lead portion 15a extends from this base portion 15e downward through an intermediate portion 15j in the shape of plate, and on the other hand, a pair of elastic pieces 15b also extend upward.

Figure 6A:
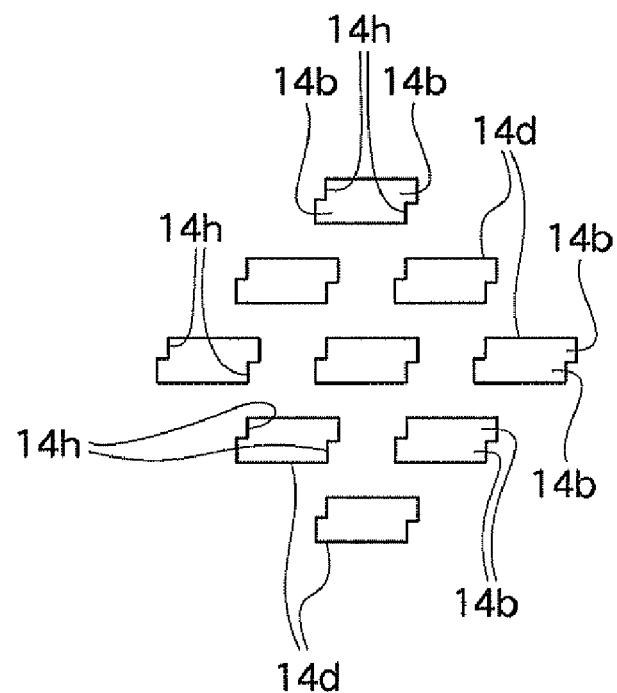
FIGS. 6A and 6B show an essential portion of a base of the IC socket in an enlarged scale, FIG. 6A showing a plan view and FIG. 6B showing a sectional view thereof.
Figure 6B:
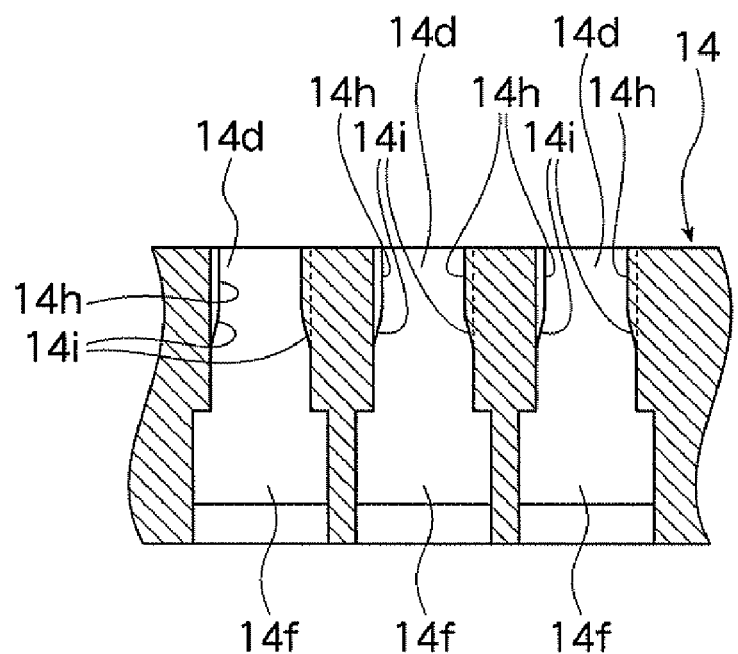

The contact pin 15 of such structure is inserted into a through hole 14d of the socket body 14 (FIG. 6B) and a through hole 16a of the movable member 16 in a manner such that the base portion 15e of the contact pin 15 is fitted from the lower side to a base portion fitting hole portion 14f formed to the lower end side of the base member 14a of the socket body 14 so as to restrict the upward movement of the base portion 15e. The fitted base portion 15e is covered and supported from lower side by the locating board 19 and then fixed to the socket body 14. The base portion 15e has an upper end 15h abutting against an abutment portion 14k formed to an upper end of the base portion fitting hole portion 14f.

The lead portion 15a of the contact pin 15 is elastically deformable. The lead portion 15a projects downward from the base member 14a, is inserted into the printed circuit board P and then soldered thereto, so as to establish an electrical connection with an electrode, not shown.

Further, a pair of plate-shaped elastic pieces 15b are formed so that the plate surfaces in the width direction of the plate shape oppose to each other and the elastic pieces extend toward the movable member 16 side disposed to the upper side of the base member 14a of the socket body 14. The contact pin 15 has contact portions 15c at the upper end portions of the paired elastic pieces 15b, respectively, so as to contact the solder ball 12b of the IC package 12.

Figure 4A:
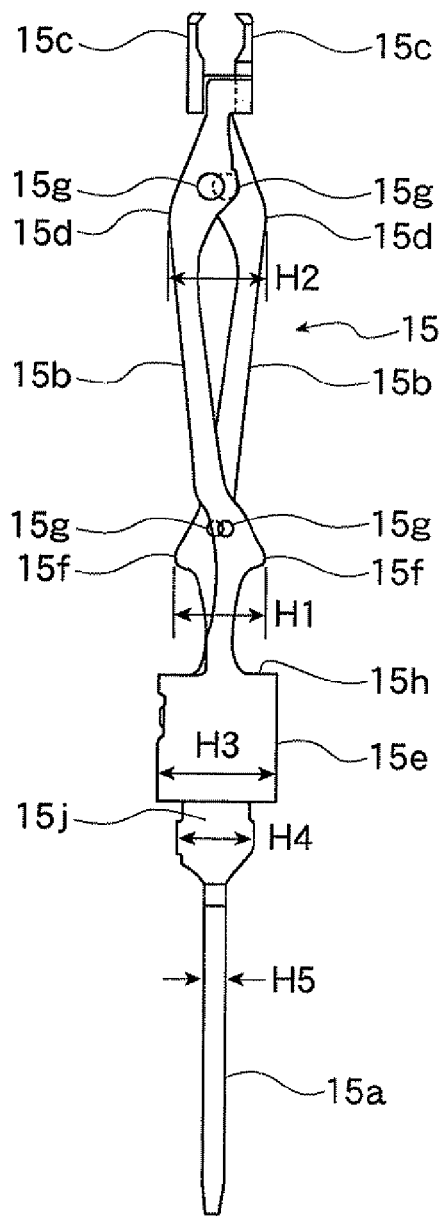

As shown in FIG. 4A, the tip end portions of the contact portions 15c are bent so that the bent end portions face each other. The paired elastic pieces 15b are pressed and elastically deformed, by the vertical movement of the movable member 16, so as to approach each other or to be separated from each other, thus being closed or opened to thereby clamp the solder ball 12b therebetween or be separated from the solder ball 12b.

The elastic pieces 15b have an elastically deformable property in the direction along the plate surface, project along the plate surface in the plate width direction at portions near the base portion 15e of the contact pin 15, and have biting portions 15f biting an inner wall of the through hole 14d of the base member 14a.

The biting portions 15f bite the inner wall of the through hole 14d by the elastic force of the elastic pieces 15b so as to give a preload in the closing direction of the contact portions 15c. That is, in the state in which the contact pins 15 are mounted on the socket body 14, a pair of biting portions 15f press the inner wall of the through hole 14d in directions opposite to each other and are then subjected to the reaction force, thus being contracted so as to provide a plate width smaller than a plate width H1 between the front ends of the biting portions 15f shown in FIG. 4A.

Furthermore, at the portion near the contact portions 15c of the elastic pieces 15b, there are formed operating portions 15d projecting in direction opposite to the biting portions 15f in the direction along the plate surface. The operating portions 15d are pressed against the inner wall of the through hole 16a of the movable member 16, and according to the movement of the movable member 16, the operating portions 15d slide along the inner wall.

Figure 4B:
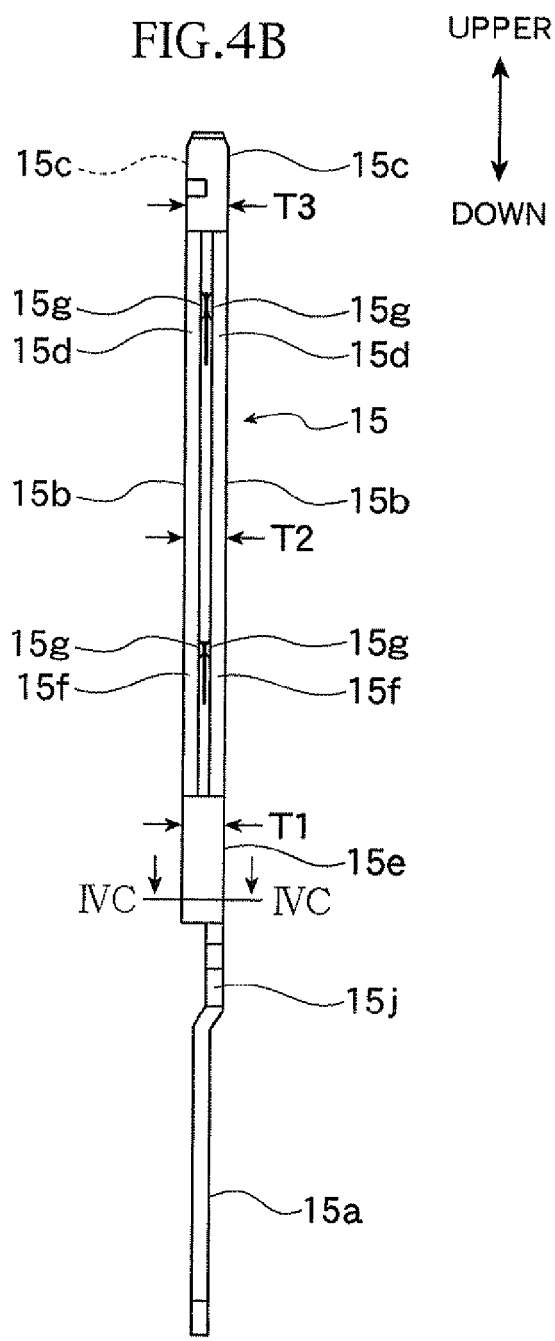
Figure 4C:
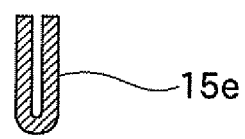

These biting portions 15f and the operating portions 15d of the paired elastic pieces 15b project respectively so as to extend in opposite directions to each other. Before the mounting to the socket body 14, that is, in the state not elastically deformed, as shown in FIGS. 4A, 4B and 4C, the width H1 between the front ends of the biting portions 15f and the width H2 between the front ends of the operating portions are both formed to be narrower than the width H3 of the base portion 15e. That is, the width between the front ends of the paired biting portions 15f is contracted in comparison with the width H1 in the state not elastically deformed. Further, the biting portions 15f are formed at a place between the base portion 15e and the contact portions 15c, and as far as the base portion 15e and the contact portions 15c are not united, the contact portions 15c will apply a preload to the terminal.

The contact pin 15 has the intermediate portion 15j, in the shape of plate, having a width H4 which is smaller than the width H3 of the base portion 15e and larger than the width H5 of the lead portion 15a, as shown in FIG. 4A.

Furthermore, projections 15g projecting toward each other by the same length are formed to be slidable to each other at portions near the biting portions 15f and the operating portions 15d of the paired elastic pieces 15b. These projections 15g have sizes always slidable to each other when the paired elastic pieces 15b are operated.

Then, with this contact pin 15, in the mutually slidable contact of the projections 15g, a thickness T1 of the base portion 15e in the direction normal to the plate surface, a thickness T2 (plate thickness direction) normal to the plate surface of the elastic pieces 15b disposed parallelly, and a thickness T3 of the contact portion 15c are formed to be all equal to each other.

Figure 12:
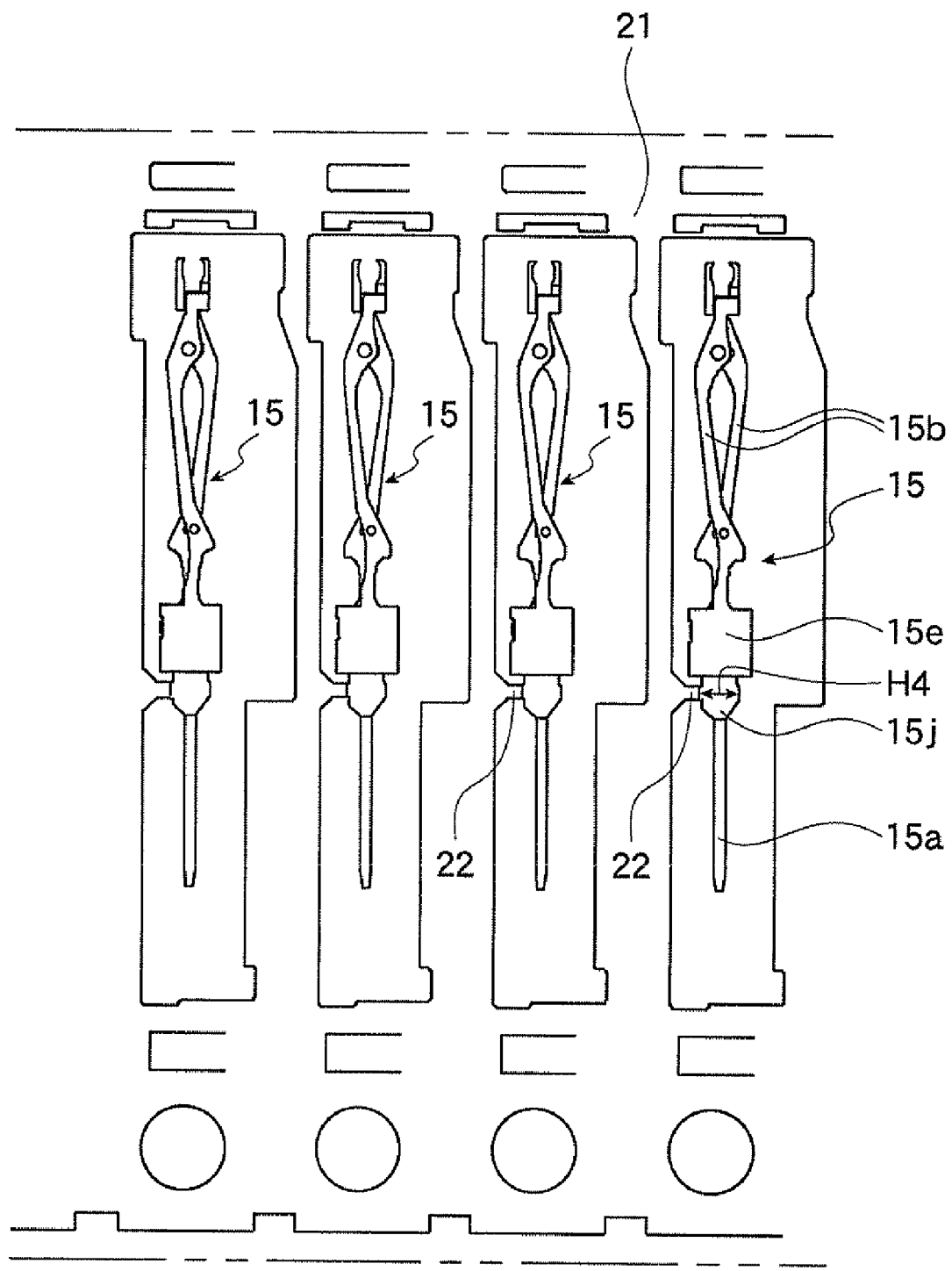
FIG. 12 is a plan view showing a manufacturing process of the contact pin according to the one embodiment of the present invention.

In the contact pin 15 of the structure mentioned above, at its shape forming, as shown in FIG. 12, the intermediate portions 15j, each having a flat shape and wide width H4, are coupled to the base material 21 through the connection portion 22, and by cutting off the connection portion 22, each contact pin 15 is separated from the base material 21. Accordingly, in the case where the lead portion 15a is cut off from the base material 21, the lead portion 15a, which has a narrow width and weak strength, is tend to be easily deformed.

However, by cutting the same at the intermediate portion 15j, which has a wide width H4, such deformation of the lead portion 15a can be prevented. In addition, the vertical and horizontal positioning of the contact pin 15 is performed by fitting the base portion 15e of the contact pin 15 into the base portion fitting hole portion 14f. Accordingly, in the case where the contact pin 15 is cut off at a portion between a peripheral edge portion of the base portion 15e and the base material 21, so-called a burr is caused at the peripheral edge portion, which may damage the fitting and positioning operations.

On the contrary, in the present embodiments since the connection portion 22 is cut off at the intermediate portion 15j below the base portion 15e of the contact pin 15, such a fear may be possibly eliminated.

In the socket body 14 in which the contact pins of the structure mentioned above are arranged, as shown in FIGS. 6A and 6B, the base portion fitting hole portions 14f into which the base portions 15e of the contact pins 15 are fitted, and a pair of elastic piece arranging portions 14b, 14b, into which a pair of elastic pieces 15b are inserted upward from the base portion fitting hole portions 14f, are continuously formed to a number of through holes 14d, respectively.

In each of these elastic piece arranging portions 14b, 14b, a bite portion (a portion to be bitten) 14h, to which the biting portion 15f of the elastic piece 15b bites, projects inward inside the through hole 14d, and the bite portion 14h has a guide surface 14i formed such that an inner wall of the lower portion of the guide surface gradually narrows in its width upward.

The bite portion 14h presses the biting portion 15f by the inward projecting amount in a state that the contact pin 15 is inserted into the socket body 14 and fixed thereto so as to apply a preload to the elastic piece 15b in the closing direction of the contact portions.

That is, by pressing the biting portion 15f by the bite portion 14h, the plate width H1 between the tip (front) ends of the biting portions 15f becomes narrow, and the preload is generated by the elastic force of the elastic pieces 15b. Because of this reason, it is necessary for the inward projecting amount and the shape of the bite portion 14h to be set so as to provide a predetermined pressure.

Furthermore, this bite portion 14h is formed so as to extend upward from a portion near the lower portion of the biting portion 15f in the state that the contact pins 15 are mounted to the socket body 14. This is because the sliding distance of the biting portion 15f at the time when the contact pin 15 is mounted, in which the biting portion 15f is pressed against the bite portion 14h, can be made short.

The movable member 16 disposed on the upper side of the socket body 14 has a plate shape as shown in FIGS. 1 to 3 and FIGS. 5A to 5C, and is disposed to be vertically movable and urged upward by a spring 25.

A plurality of through holes 16a are formed to this movable member 16 so as to correspond to the contact pins 15, respectively, and the paired elastic pieces 15b of each contact pin 15 is inserted into each through hole 16a. When inserted, the operating portions 15d of the elastic pieces 15b abut against cam portions 16b formed to the inner wall of the through hole 16a, and when the movable member 16 is lowered, the operating portions 15d of the elastic pieces 15b are pressed by the cam portions 16b from the state shown in FIG. 5A to the state shown in FIG. 5B, and the paired elastic pieces 15b are elastically deformed and the paired contact portions 15c are then opened.

On the other hand, when the movable member 16 is moved upward by the urging force of the spring 25 in a state in which the IC package 12 is accommodated in the IC socket 11, the solder ball 12b is clamped between the paired contact portions 15c of the contact pin 15 as shown in FIG. 5C.

The locating board 19 has substantially a rectangular shape as shown in FIGS. 8 to 11C, and is provided with four engaging pieces 19a and projections 19b at peripheral edge portions thereof so as to project upward in the illustrated state.

According to this arrangement, the locating board 19 is guided to be vertically movable with respect to the socket body 14. In the most lowered position of the locating board 19, i.e., most separated position from the socket body 14, pawls formed to the engaging pieces 19a are engaged with the socket body 14 and secured to the most lowered position.

Further, the locating board 19 is provided with a plurality of insertion holes 19c into which the contact pins 15 are inserted, respectively, and each of the insertion holes 19c is formed with a lead insertion portion 19d into which the lead portion 15a of the contact pin 15 is inserted. Furthermore, an intermediate insertion portion 19e into which the intermediate portion 15j of the contact pin 15 is inserted is also formed to the upper side of the lead insertion portion 19d.

The lead insertion portion 19d has a width substantially equal to that of the lead portion 15a. The intermediate insertion portion 19e is formed with a pair of tapered surfaces 19f so that the width is made narrow toward the lead insertion portion 19d, and when the lead portion 15a is inserted into the locating board 19, the tip end portion of the lead portion 15a is guided by the tapered surfaces 19f so as to be inserted into the insertion hole 19c.

According to the structure mentioned above, when the locating board 19 is separated downward from the lower surface of the socket body 14, the lead portion 15a of the contact pin 15 is positioned to a position corresponding to the insertion hole P1 of the printed circuit board P.

On the other hand, when the locating board 19 is raised upward most closely to the lower surface of the socket body 14, the locating board 19 abuts against the lower surface of the base portion 15e of the contact pin 15 to thereby prevent the contact pin 15 from being moved downward.

Figure 13:
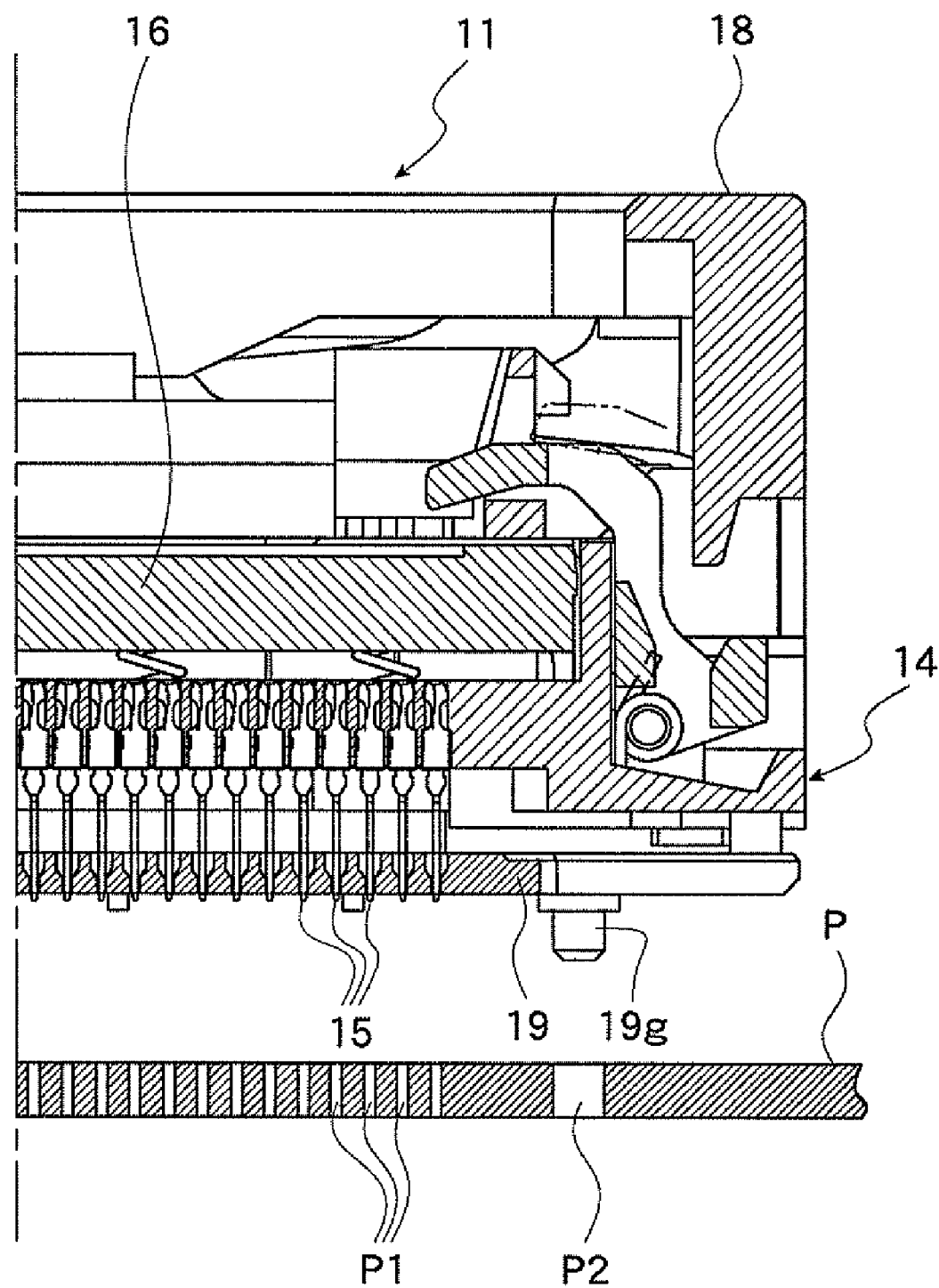
FIG. 13 is a sectional view showing a state before the mounting of the IC socket on a printed circuit board.

Furthermore, positioning pins 19g are provided to the bottom surface of the locating board 19, as shown in FIG. 13, so as to be fitted into positioning holes P2 of the printed circuit board P.

The IC socket 11 of the structures mentioned above will be assembled in the following manner.

Figure 7A:
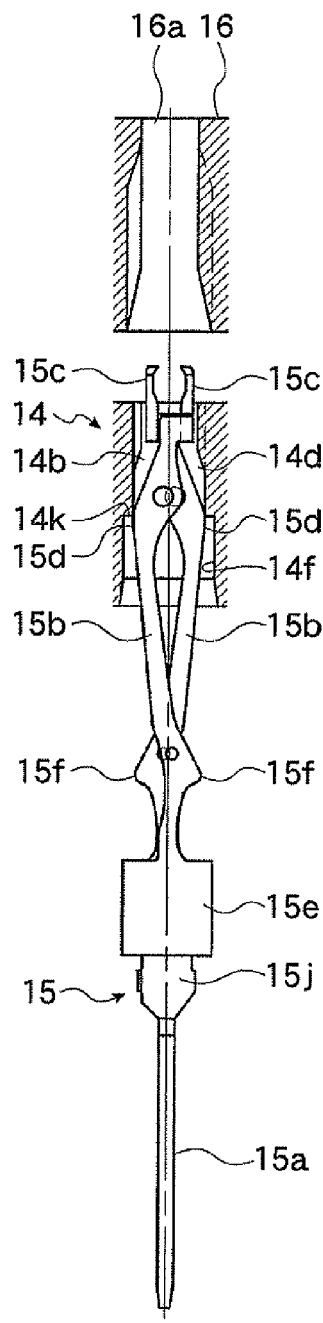
FIGS. 7A to 7C show a contact pin-mounting processes according to the present invention.
Figure 7B:
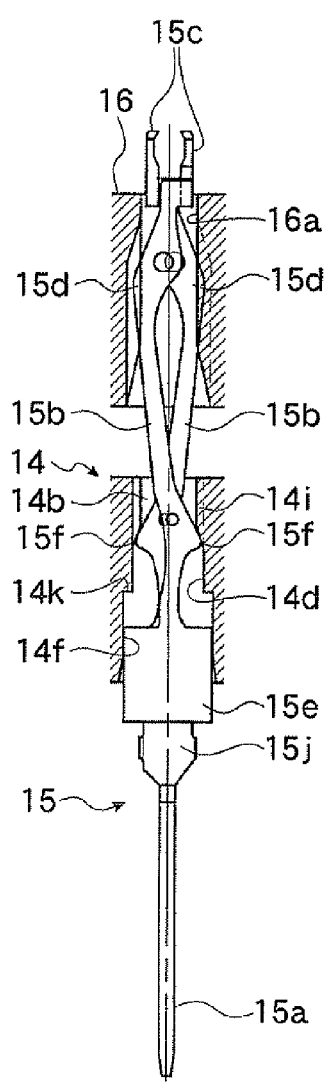
Figure 7C:
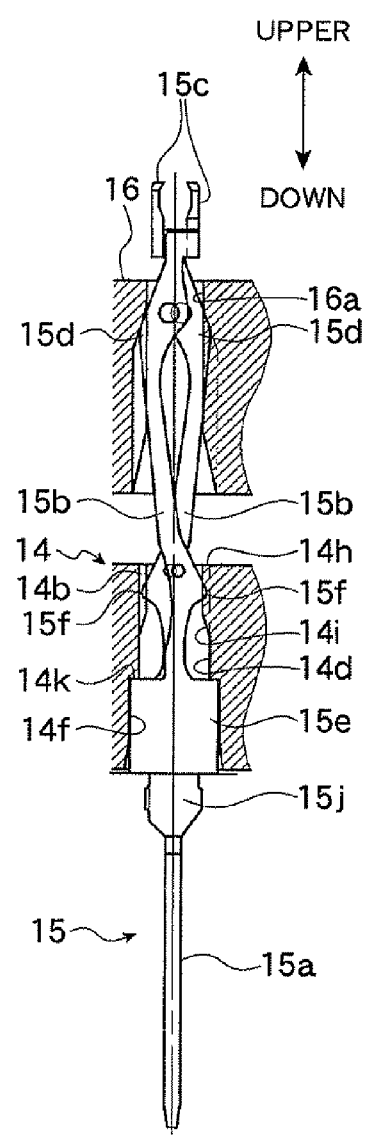
Figure 8:
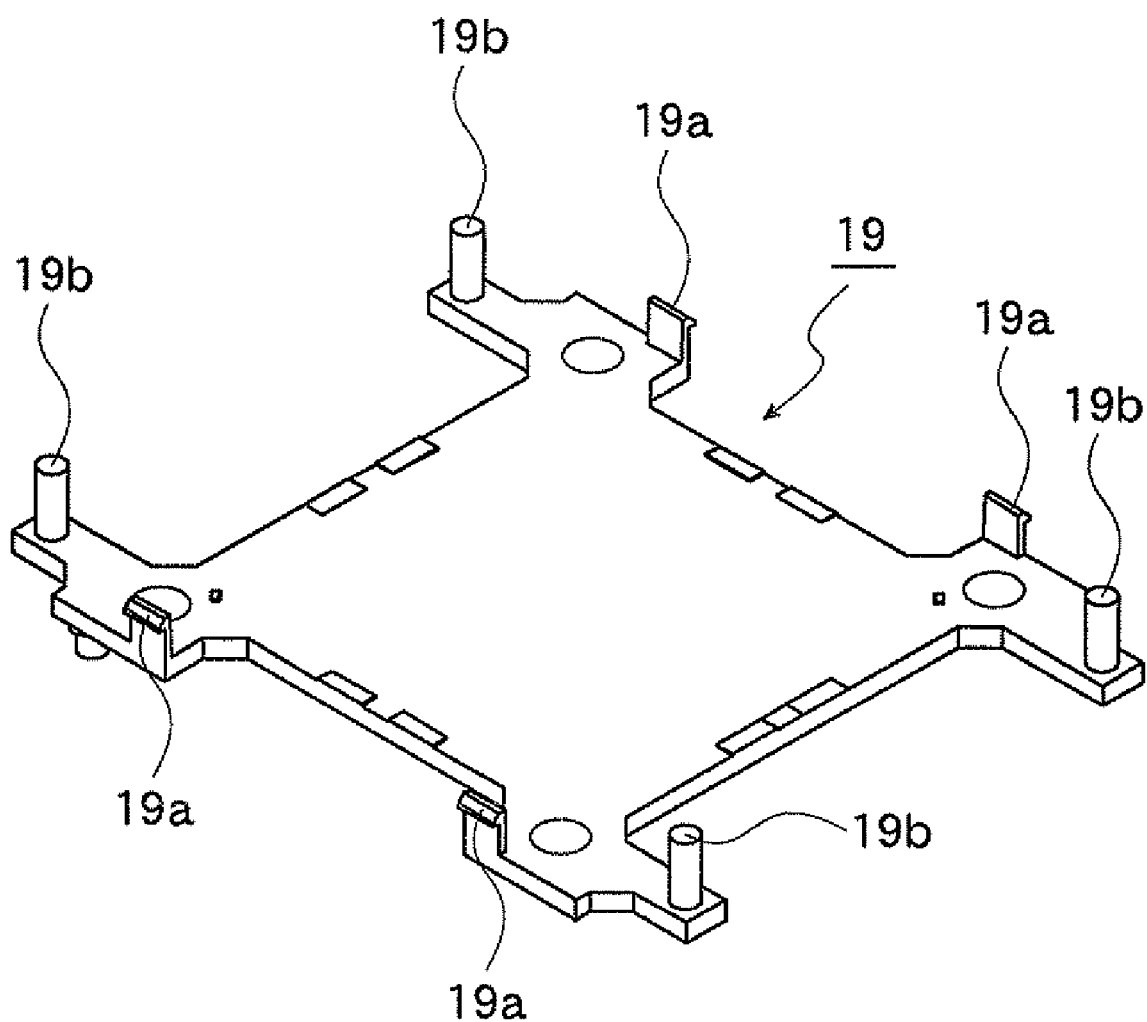
FIG. 8 is a perspective view of a locating (locate) board according to the one embodiment of the present invention.
Figure 9:
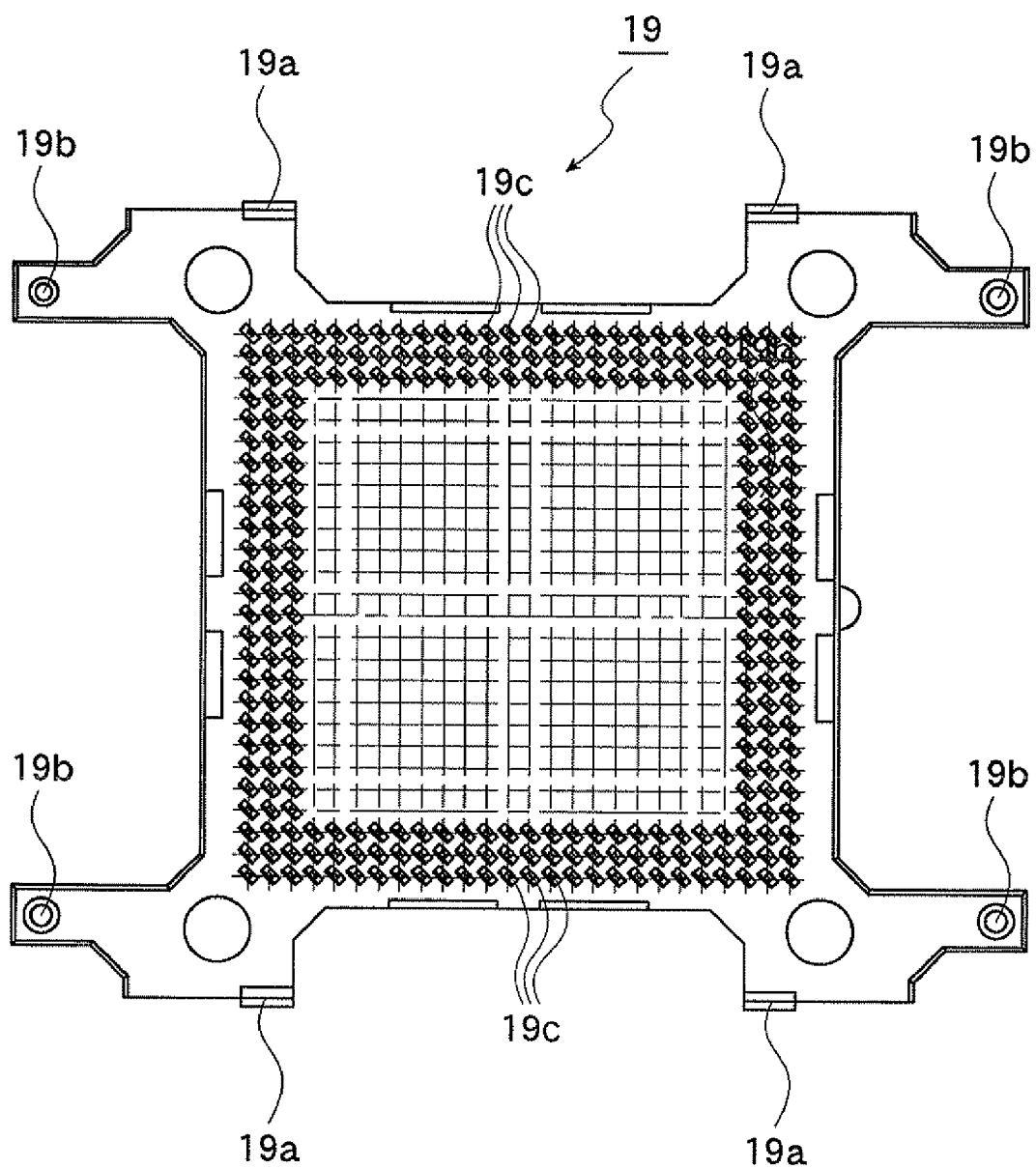
FIG. 9 is a plan view of the locating board.
Figure 10:
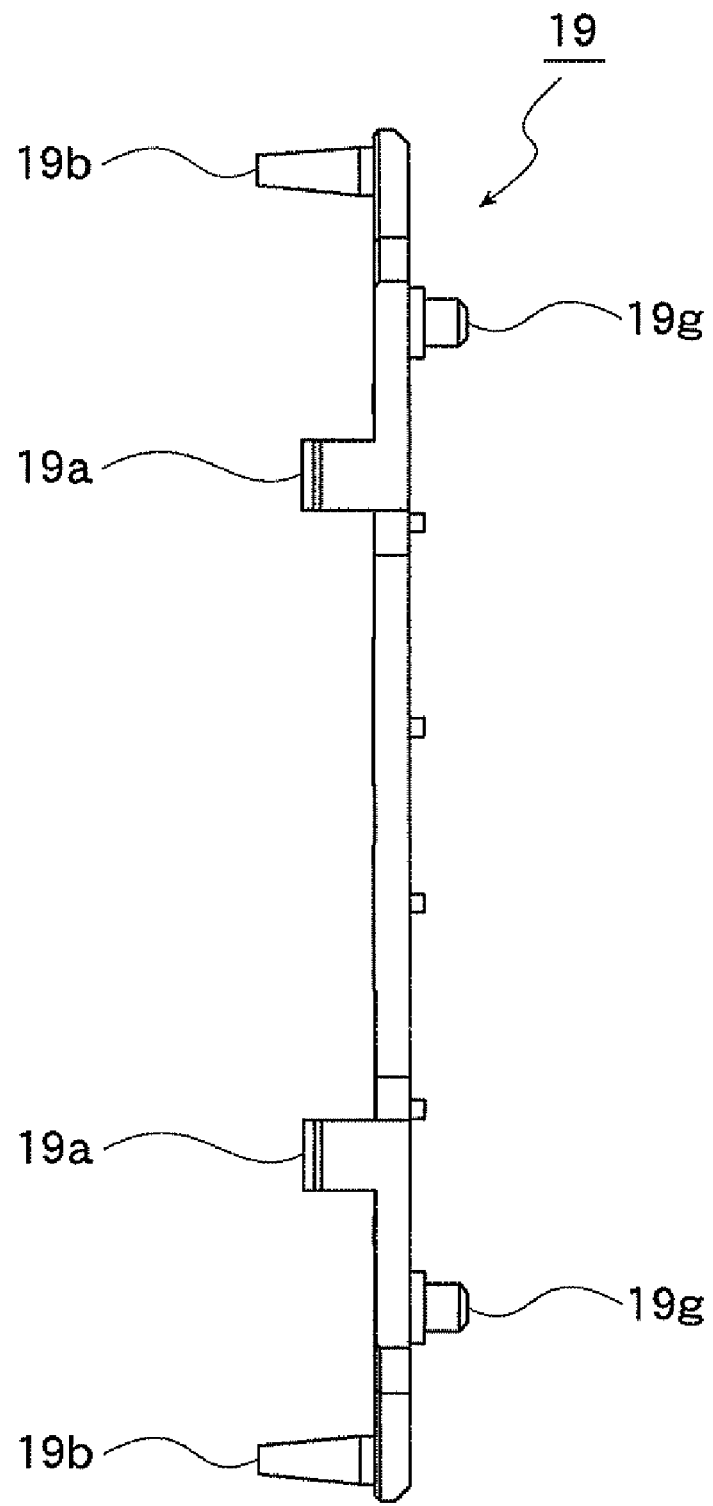
FIG. 10 is a right side view of the locating board.
Figure 11A:
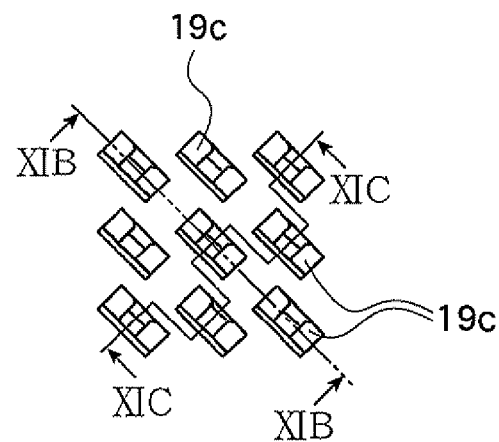
Figure 11B:
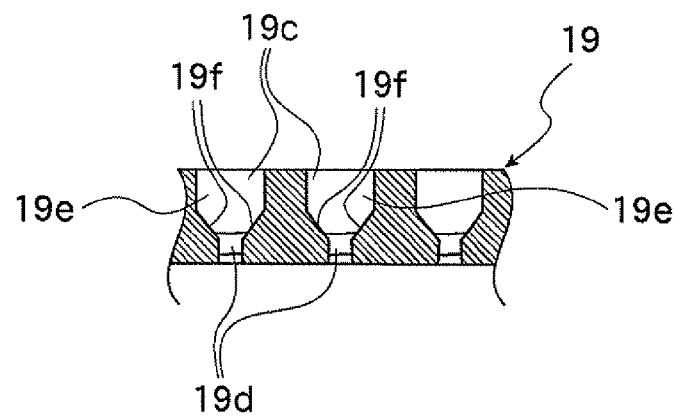
Figure 11C:
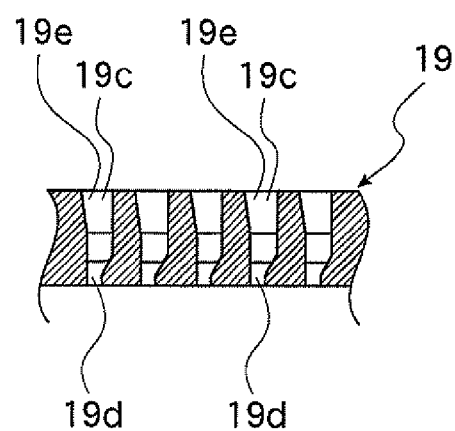

First, the contact pins 15 are inserted into the socket body 14 and the movable member 16, and when fixed, as shown in FIGS. 7A to 7C, the front end portions of the contact pins 15 are inserted from their contact portion sides into the through holes of the socket body 14 and the movable member 16 from the lower direction. At this time, the paired elastic piece arrangement portions 14b, 14b of the through hole 14d of the socket body 14 are formed to be larger than projecting areas in the insertion direction of the contact portions 15c and the operating portions 15d of the paired elastic pieces 15b.

Accordingly, when the contact pin 15 is being inserted into the through hole 14d from the lower side, the elastic pieces 15b are not press-contacted to the inner wall of the through hole 14d, i.e., substantially in the non-contact state, during the time from the insertion of the elastic pieces 15b from the insertion starting position shown in FIG. 7A till the arrival of the biting portion 15f to the guide surface 14i.

Then, when the biting portions 15f of the contact pins 15 are slid further upward in press-contact to the guide surface 14i, as shown in FIG. 7C, the base portions 15e of the contact pins 15 are fitted into the base portion fitting hole portions 14f of the through holes 14d, and the fitted upper ends thereof abut against the abutting portions 14k of the base portion fitting hole portions 14f, the biting portions 15f reach the bite portion 14h, and the biting portions 15f are fixed in a state of biting the bite portions 14h by the elastic force of the elastic pieces 15b, thus limiting the upward movement.

When the base portion 15e of the contact pin 15 is fitted to the base portion fitting hole portion 14f of the socket body 14, the contact pin 15 can be prevented from coming off downward even if a small force is applied thereto. Accordingly, when the IC socket 11 is mounted to the printed circuit board P, the contact pins 15 can be prevented from accidentally coming off.

Thereafter, the locating board 19 is mounted to be vertically movable to the socket body 14 from the lower side by means of engaging pieces 19a. At this time, the front end portions of the lead portion 15a of the contact pins 15 are guided by the tapered surfaces 19f of the intermediate insertion portions 19e of the locating board 19 and easily inserted into the lead insertion portions 19d, respectively.

Figure 16:
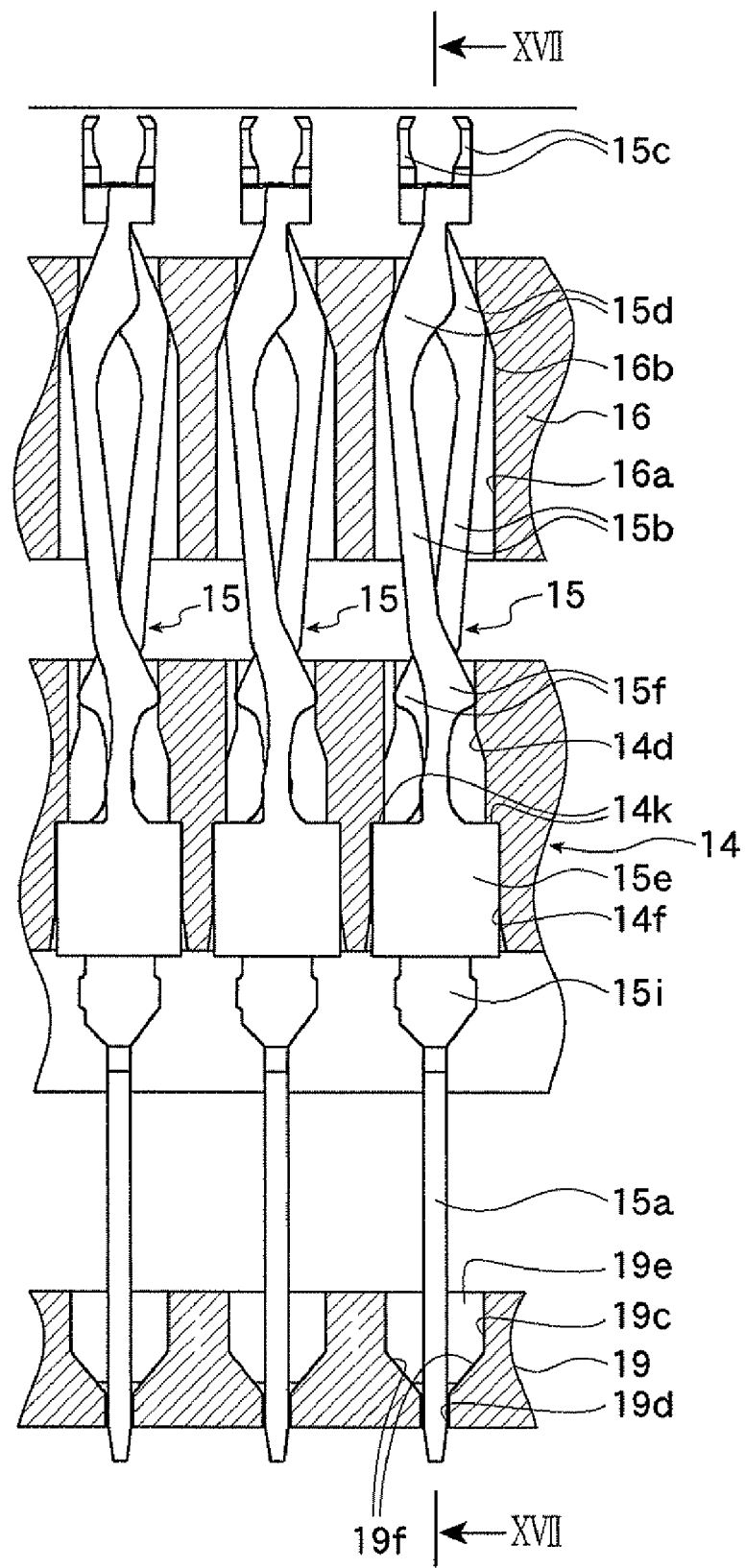
FIG. 16 is a sectional view, in an enlarged scale, corresponding to the arrangement of FIG. 13.
Figure 17:
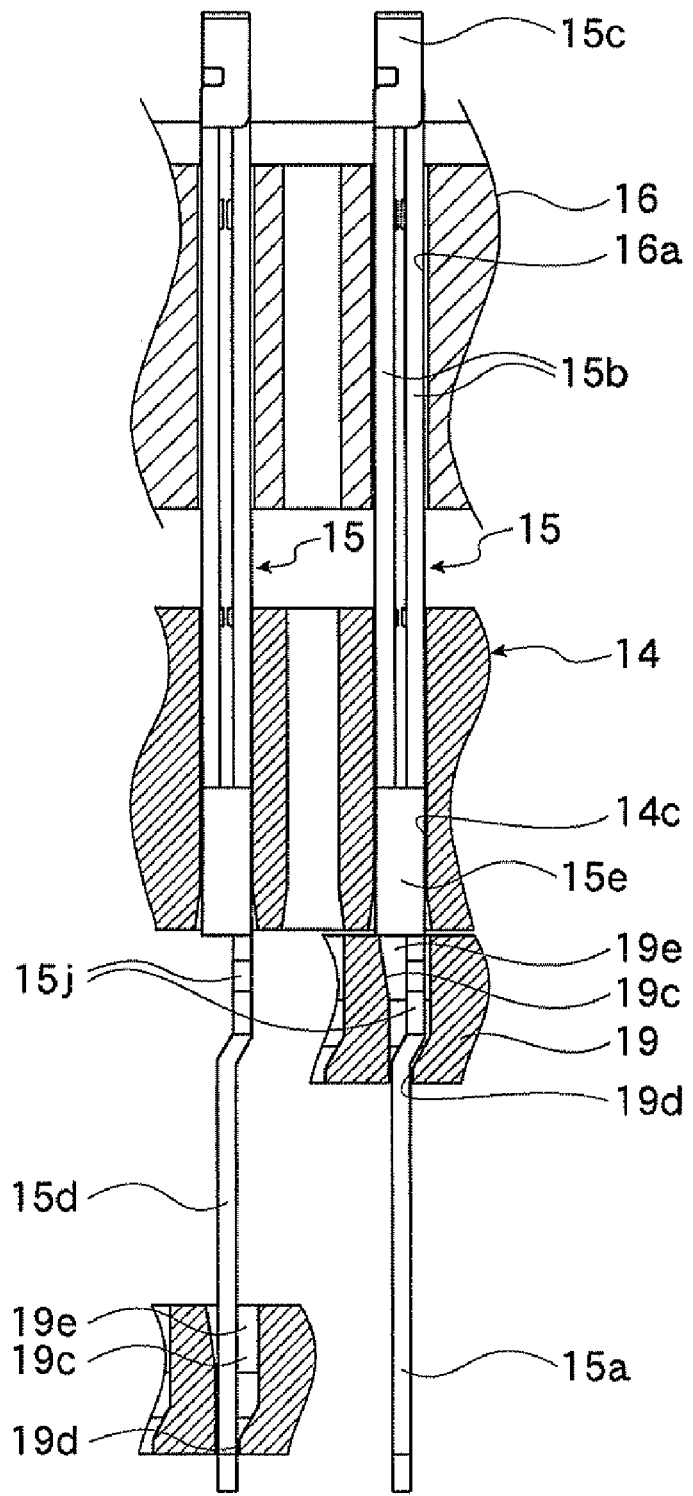
FIG. 17 is a view along XVII-XVII line in FIG. 16.

When the locating board 19 is lowered to the most lowered position, the plural lead portions 15a are positioned in the manner of slightly projecting downward from the locating board 19, as shown in FIGS. 13, 16 and 17.

Figure 14:
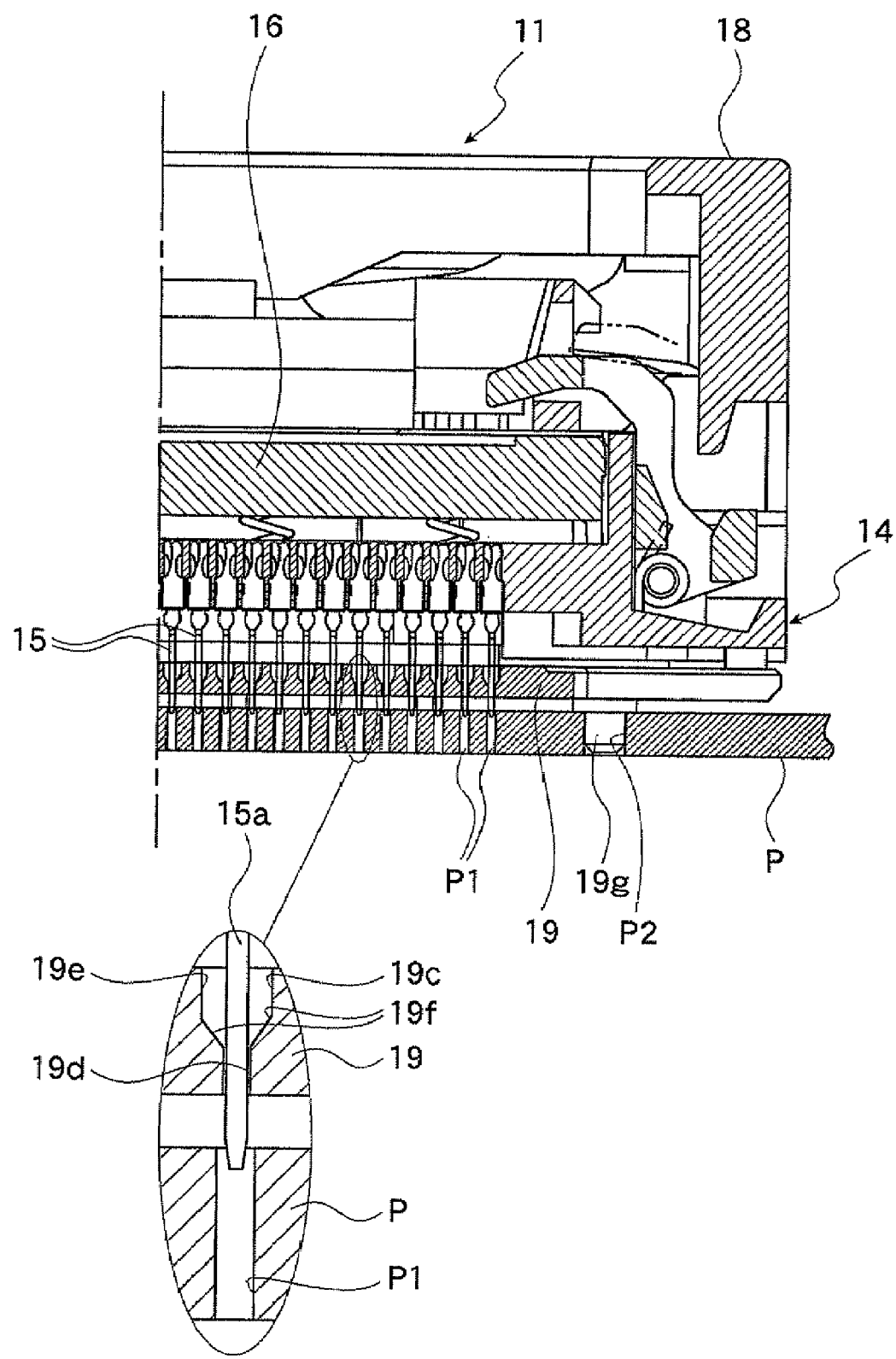
FIG. 14 is a sectional view showing a process of the mounting of the IC socket on the printed circuit board.

From the state mentioned above, the positioning pins 19g of the locating board 19 are fitted into the positioning holes P2 of the printed circuit board P to thereby arrange the IC socket 11 to the predetermined position of the locating board 19, and the plural lead portions 15a positioned by the locating board 19 are inserted into the insertion holes P1 of the printed circuit board P, as shown in FIG. 14.

Figure 15:
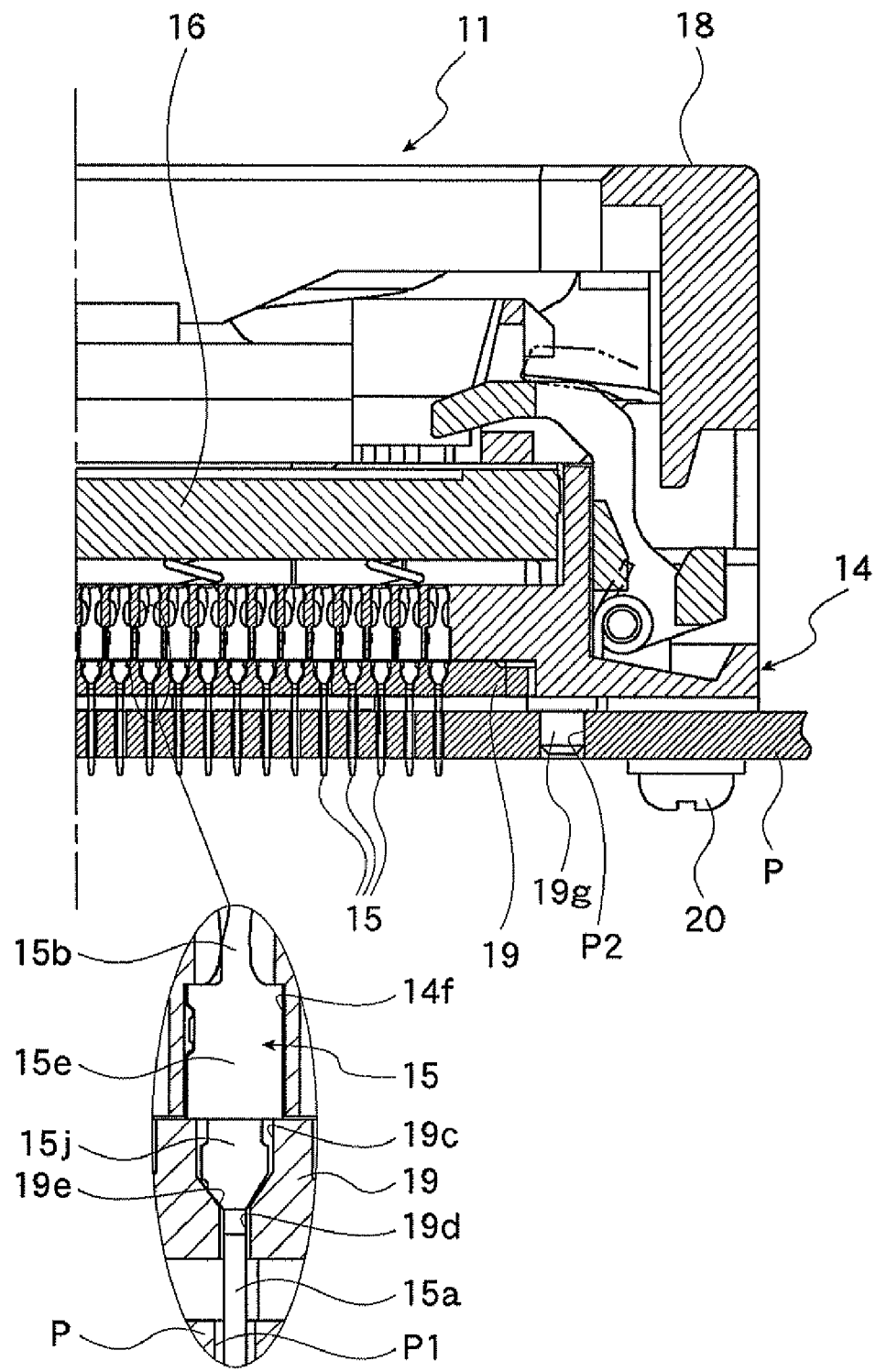
FIG. 15 is a sectional view showing a state after the completion of the mounting of the IC socket on the printed circuit board.

Thereafter, as shown in FIG. 15, the locating board 19 is moved further upward so as to most closely approach the lower surface of the socket body 14, the upper surface of the locating board 19 abuts against the lower surface of the base portion 15e of the contact pin 15 to thereby limit the downward movement of the contact pin 15, and the positioning of the contact pin 15 in the vertical direction is performed. In addition, the socket body 14 is fixed to the printed circuit board P by means of screws, for example, and the locating board 19 is clamped by both the socket body 14 and the printed circuit board P. In this state, the solder ball is fitted, and then, when the soldering operation is performed, the socket body 14 can be fixed without floating from the printed circuit board P.

According to the structure mentioned above, when the IC socket 11 is mounted to the printed circuit board P, the contact pins 15 are inserted into the through holes 14d of the socket body 14 from the lower side thereof, and the base portions 15e of the contact pins 15 are fitted to the base portion fitting hole portions 14f of the socket body 14. Thereby, the contact pins 15 can be arranged at relatively weak force and prevented from being deformed, and the arranging workability can be also improved. In addition, the contact pins 15 can be held at such a force as prevented from coming off from the socket body 14.

Further, the lead portions 15a of the contact pins 15 can be positioned at the positions corresponding to the insertion holes P1 of the printed circuit board P in a state in which the locating board 19 is separated from the lower surface of the socket body 14, thereby easily and accurately inserting the lead portions 15a of the contact pins 15 into the insertion holes P1 of the printed circuit board P.

Furthermore, by mounting the IC socket 11 to the printed circuit board P, the locating board 19 approaches most closely the lower surface of the socket body 14. Accordingly, the locating board 19 abuts against the lower surface of the base portions 15e of the contact pins 15, thereby limiting the downward movement of the contact pins 15, and the positioning of the contact pins 15 in the vertical direction can be performed by the socket body 14.

Accordingly, since the locating board 19 achieves a function of a conventional adapter, it is not necessary to independently dispose an adapter, and therefore, the number of parts and the working processes can be eliminated as well as elimination of a space for locating the adapter. Thus, the IC socket 11 can be minimized, and other parts can be increased in strength, and freedom in design can be improved. It is also not necessary to make positional alignment between the socket body 14 and the adapter.

Furthermore, the contact pin 15 has the base portion 15e which is bent in U-shape in horizontal section, and the base portion 15e is fitted to the base portion fitting hole portion 14f of the socket body 14. Accordingly, the base portion 15e has no flat-plate shape and has some thickness, so that the base portion 15e is easily fitted to the base portion fitting hole portion 14f of the socket body 14.

Still furthermore, the contact pin 15 is provided with the flat-plate shaped intermediate portion 15j between the base portion 15e and the lead portion 15a, and the intermediate portion 15j has the width H4 smaller than the width H3 of the base portion 15e and larger than the width H5 of the lead portion 15a. In addition, the locating board 19 is provided with the intermediate portion inserting portion 19e into which the plate-shaped intermediate portion 15j is inserted, and the intermediate portion inserting portion 19e has a width larger than the lead insertion portion 19d into which the lead 15a is inserted.

Accordingly, the intermediate portion 15j is utilized as a connection portion to the base material 21 at the time of forming the contact pin, and by cutting this connection portion, with this slightly wider intermediate portion 15j being held, the contact pin 15 can be formed in good condition.

Further, when the connection portion 22 is formed to the lead portion 15a and the connection portion 22 is cut off from the base material 21 with the lead portion 15a being held, the lead portion 15a may be deformed. In addition, when the connection portion 22 is formed to the base portion 15e and the connection portion 22 is cut off from the base material 21 with the base portion 15e being held, since the base portion 15e has substantially U-shaped section, it is difficult to hold the base portion 15e having U-shaped section.

Moreover, the plate-shaped intermediate portion 15j has the width H4 smaller than the width H3 of the base portion 15e and larger than the width H5 of the lead portion 15a, and it is inserted into the intermediate portion inserting portion 19e formed to the locating board 19, so that when the base portion 15e is pressed by the locating board 19, the base portion can be surely held by the locating board without any inconveniences caused by the intermediate portion 15j.

Furthermore, the intermediate portion 19e has a pair of tapered surfaces 19f gradually narrowing toward the lead insertion portion 19d, and when the locating board 19 is inserted into the lead portion 15a, the tip (front) end portion of the lead portion 15a is guided by the tapered surfaces 19f and inserted into the lead insertion portion 19d, so that the lead portion 15a of the contact pin 15 can be easily inserted into the lead insertion portion 19d of the locating board 19 and set to the predetermined position.

Further, in the embodiment mentioned above, although there is described the example in which the contact pin 15 is provided with the paired elastic pieces 15b,15b, the present invention is not limited to such structure, and a contact pin may be provided with a single elastic piece extending from the base portion.

It is further to be noted that the present invention is not limited to the described embodiments and many other changes and modifications may be made without departing from the scopes of the appended claims.

What is claimed is:

1. A socket for an electrical part mounted on a wiring board, comprising:
   a plurality of contact pins, each of the contact pins having a base portion, an elastic piece extending upward from the base portions and electrically contacted to a terminal of the electrical part by pinching the terminal with contact portions being formed on a top of the elastic piece, a lead portion extending downward from the base portion and inserted to an insertion hole of the wiring board;

a socket body having through holes into which the contact pins are inserted from an under side of the socket body, wherein the through holes have fitting hole portions to which the base portions are fitted so as to prevent an upward movement of the contact pins; and a locating board being placed vertically movable, on a lower side of the socket body, and being formed with a plurality if insertion holes corresponding respectively to the plurality of contact pins with each contact pin being inserted into the corresponding insertion hole, and when the locating board is separated from a lower surface of the socket body, the lead portion of each contact pin is positioned to a position corresponding to the corresponding insertion hole of the wiring board, and when the locating board approaches most closely the lower surface of the socket body, the locating board contacts a lower surface of the base portion of each of the contact pins, and the lower surface of the socket body, so as to restrict a downward movement of each of the contact pins, wherein each of the contact pins are provided with an intermediate portion in a shape of a plate between the base portion and the lead portion, the intermediate portion having a width smaller than that of the base portion and larger than that of the lead portion, and each insertion hole is formed with an intermediate insertion portion into which the intermediate portion of the corresponding contact pin is inserted and a lead insertion portion into which the lead portion of the corresponding contact pin is inserted, the intermediate insertion portion having a width larger than that of the lead insertion portion.

2. The socket for an electrical part according to claim 1, wherein the contact pin is formed from a conductive plate member and is provided with a pair of elastic pieces, and the base portion is bent so as to provide a U-shaped horizontal section.

3. The socket for an electrical part according to claim 1, wherein the intermediate portion has a pair of tapered surfaces so as to reduce a width toward the lead insertion portion, and when the lead portion is inserted into the locating board, the tip end of the lead portion is guided by the tapered surfaces so as to be inserted into the lead insertion portion.

4. The socket for an electrical part according to claim 1, wherein the intermediate portion has a pair of tapered surfaces so as to reduce a width toward the lead insertion portion, and when the lead portion is inserted into the locating board, the tip end of the lead portion is guided by the tapered surfaces so as to be inserted into the lead insertion portion.

5. A socket for an electrical part mounted on a wiring board, comprising:

a plurality of contact pins each of the contact pins having a base portion, an elastic piece extending upward from the base portion and electrically contacted to a terminal of the electrical part by pinching the terminal with contact portions being formed on the top of the elastic piece, and a lead portion extending downward from the base portion and inserted to a corresponding respective insertion hole of the wiring board;

a socket body having a plurality of through holes corresponding respectively to the plurality of contact pins, and into which the corresponding contact pins are respectively inserted from an under side of the socket body, wherein each of the through holes has a fitting hole portion to which the base portion of the corresponding contact pin is fitted so as to prevent an upward movement of the contact pins; and a locating board being placed vertically movable, on a lower side of the socket body, and being formed with a plurality if insertion holes corresponding respectively to the plurality of contact pins with each contact pin being inserted into the corresponding insertion hole, and when the locating board is separated from a lower surface of the socket body, the lead portion of each contact pin is positioned to a position corresponding to the corresponding insertion hole of the wiring board, and when the locating board approaches most closely the lower surface of the socket body, the locating board contacts a lower surface of the base portion of each of the contact pins, and the lower surface of the socket body, so as to restrict a downward movement of each of the contact pins, wherein each of the contact pins are provided with an intermediate portion in a shape of a plate between the base portion and the lead portion, the intermediate portion having a width smaller than that of the base portion and larger than that of the lead portion, and each insertion hole is formed with an intermediate insertion portion into which the intermediate portion of the corresponding contact pin is inserted and a lead insertion portion into which the lead portion of the corresponding contact pin is inserted, the intermediate insertion portion having a width larger than that of the lead insertion portion.

* * * * *

UNITED STATES PATENT AND TRADEMARK OFFICE
CERTIFICATE OF CORRECTION

| | |
|---|---|
| PATENT NO. | : 7,635,277 B2 |
| APPLICATION NO. | : 11/782903 |
| DATED | : December 22, 2009 |
| INVENTOR(S) | : Hokuto Kanesashi |

It is certified that error appears in the above-identified patent and that said Letters Patent is hereby corrected as shown below:

Column 12, Line 5, change "contact pins each" to --contact pins, each--.

Signed and Sealed this

Twenty-third Day of February, 2010

David J. Kappos
*Director of the United States Patent and Trademark Office*